United States Patent

Blank et al.

[15] 3,643,253

[45] Feb. 15, 1972

[54] ALL-FET DIGITAL-TO-ANALOG CONVERTER

[72] Inventors: Hans G. Blank, New Rochelle; Richard M. Greene, Smithtown, both of N.Y.

[73] Assignee: GTE Laboratories Incorporated

[22] Filed: Feb. 16, 1970

[21] Appl. No.: 11,458

[52] U.S. Cl. .......................340/347 DA, 307/304, 330/30 D, 330/69

[51] Int. Cl. .......................H03k 13/02

[58] Field of Search .............340/347 AD, 347 DA; 307/205, 307/221 C, 251, 279, 304; 330/18, 19, 35, 30, 69; 317/235 A, 235 B, 235 C

[56] References Cited

UNITED STATES PATENTS

| | | | |
|---|---|---|---|
| 3,145,377 | 8/1964 | Saal | 340/347 DA |
| 3,508,084 | 4/1970 | Warner | 307/304 |
| 3,444,550 | 5/1969 | Paulus | 340/347 AD |
| 3,049,701 | 8/1962 | Amdahl et al. | 340/347 DA |
| 3,515,901 | 6/1970 | White | 307/304 X |

*Primary Examiner*—Maynard R. Wilbur
*Assistant Examiner*—Leo H. Boudreau
*Attorney*—Irving M. Kriegeman

[57] ABSTRACT

A digital-to-analog converter apparatus which receives a plurality of input voltages representative of the digits of a number and generates an analog voltage of the number. The apparatus includes a plurality of coupled voltage difference amplifiers, with one amplifier being provided for each digit of the number. The amplifiers, which perform successive multiplication and subtraction operations upon the input voltages, are ordered in the same sequence as the digits of the number. Each amplifier consists of a plurality of substantially identical field-effect devices connected in a series arrangement.

11 Claims, 5 Drawing Figures

INVENTORS.
RICHARD GREENE
HANS G. BLANK

M. Novack
ATTORNEY.

INVENTORS.
RICHARD GREENE
HANS G. BLANK
M. Novack
ATTORNEY.

ALL-FET DIGITAL-TO-ANALOG CONVERTER

BACKGROUND OF THE INVENTION

This invention relates to digital-to-analog converter circuits and, more particularly, to an apparatus for providing an analog voltage of a number having digits represented by a plurality of input voltages.

The increasing use of digital data processing and control techniques has emphasized the need for efficient circuits which convert digital signals into analog form. A common way to convert digital to analog signals utilizes weighted current summing resistors or resistor ladder networks that are controlled by switches responsive to binary signals. This type of apparatus generally requires high-precision resistors in addition to switches and an amplifier output circuit. An inherent problem of the weighted resistor technique is that it requires wide resistance value variations, or, if a ladder is used, the resistors must be very carefully matched. Precision resistors are costly and are difficult to produce in integrated circuits. In addition, resistors formed in integrated circuit chips require relatively large areas and generally have undesirable temperature dependence.

Accordingly, it is an object of this invention to provide an improved digital-to-analog converter which is adaptable to integrated circuit fabrication.

SUMMARY OF THE INVENTION

The present invention provides an improved digital-to-analog converter which achieves precision operation without requiring precision resistors. The invention is particularly suitable for integrated circuit manufacture as it can be completely fabricated using only field-effect transistor (FET) devices such as metal-oxide-semiconductor field effect transistors (MOSFETs).

A FET consists of a substrate of semiconductor material having regions therein denoted as "source" and "drain." A carrier conduction channel lies between these regions and the conductance of this channel is controlled by an electric field. In an insulated-gate field effect transistor (IGFET) a control electrode known as a "gate" overlies the channel and is separated therefrom by a region of insulating material. Voltages applied between the gate electrode and the semiconductor substrate control the conductance of the channel by field effect. The MOSFET is a type of IGFET in which the insulating material is an oxide layer and the gate is an overlying metal layer. A feature of the digital-to-analog converter of this invention is that it can be completely fabricated using only MOSFETs which have identical characteristics and geometries. In integrated circuit manufacture it is easier and therefore desirable to manufacture circuits which utilize identical devices.

The present invention incorporates difference amplifier circuits which are disclosed in the copending U.S. application Ser. No. 11,598 of Richard Greene filed of even date herewith and assigned to the same assignee as the present application. These difference amplifier circuits utilize a plurality of substantially identical field effect devices connected in a series arrangement. The operation of these circuits will be described in some detail hereinbelow to the extent necessary for an understanding of the present invention, but a complete description of these circuits can be found in the above-referenced application.

In accordance with the instant invention, apparatus is provided for receiving a plurality of input voltages representative of the digits of a number and for generating an analog voltage of the number. The apparatus includes a plurality of voltage difference amplifiers, with one amplifier being provided for each digit of the number (i.e., for each input voltage). The amplifiers, which perform successive multiplication and subtraction operations upon the input voltages, are ordered in the same sequence as the digits of the number.

Each amplifier includes the following elements: at least three field-effect devices having substantially identical operating characteristics, each device having drain, source, and gate electrodes. The devices are connected in a series arrangement with the source electrode of each device coupled to the drain electrode of the next device in the arrangement. The source electrode of the device at one end of the series arrangement and the drain electrode of the device at the other end of the series arrangement define the "source end" and the "drain end," respectively, of the series arrangement. Each of the devices in the arrangement except a first and second of said devices has its gate electrode coupled to its drain electrode. First and second input terminals are coupled to the gate electrodes of the first and second devices, respectively. Means are provided for applying a first bias voltage between the drain end and the source end of the series arrangement. Also, an output terminal is coupled to the drain electrode of one of the devices.

The adjacent amplifiers of the invention are coupled together. More specifically, the output terminal of each amplifier is coupled to the second input terminal of the next amplifier in the order. Each input voltage is applied to the first input terminal of its corresponding amplifier. The output terminal of the last amplifier in the order provides the analog voltage of the number.

In a preferred embodiment of the invention a second bias voltage is generated by applying the first bias voltage to a voltage divider circuit which consists of a series arrangement of field-effect devices. This second bias voltage is applied to the second input terminal of the first amplifier in the order.

Further features and advantages of the invention will become more readily apparent from the following detailed description when taken in conjunction with the accompanying drawings.

DESCRIPTION OF THE PREFERRED EMBODIMENTS

Figure 1:
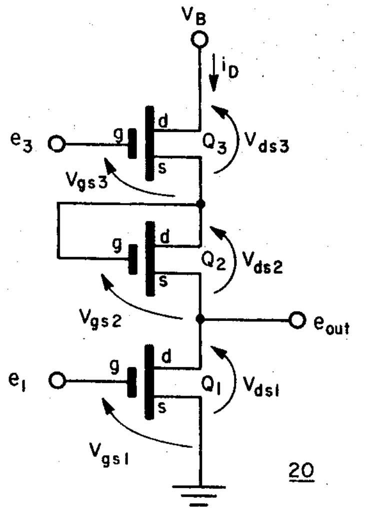
FIGS. 1 and 2 are schematic circuit diagrams of voltage difference amplifiers utilized in the invention.

Referring now to FIG. 1 there is shown a linear voltage difference amplifier 20 which is utilized in the present invention. The amplifier consists of field-effect transistor devices $Q_1$, $Q_2$ and $Q_3$ which have substantially identical operating characteristics and, preferably, are fabricated in the same semiconductor substrate. The devices shown in FIG. 2 and in subsequent embodiments of the invention are each depicted as MOSFETs but the invention applies generally to field-effect devices which exhibit square law characteristics. The drain electrode of $Q_1$ is coupled to the source electrode of $Q_2$ and the drain electrode of $Q_2$ is coupled to the source electrode of $Q_3$. The source electrode of $Q_1$ is coupled to ground reference potential and the drain electrode of $Q_3$ is coupled to a bias voltage $V_B$. (All voltages are measured with respect to ground potential.) The substrate of each MOSFET (not shown) is at ground potential as is the normal practice for devices fabricated on the same substrate. The gate electrode of $Q_2$ is coupled to its drain electrode and input voltages $e_1$ and $e_3$ are applied to the gate electrodes of $Q_1$ and $Q_3$ respectively. An output voltage $e_{out}$ is measured at the drain electrode of $Q_1$.

For linear operation of the difference amplifier the field-effect devices should operate in their saturation regions so that each device exhibits square law characteristics. In general, a MOSFET will operate in its saturation region whenever $V_{th}< V_{gs} \quad V_{ds}+V_{th}$ where $V_{ds}$ and $V_{gs}$ are the drain-to-source and gate-to-source voltages of the device and $V_{th}$ is the threshold The output voltage of difference amplifier 20 as derived from the above equations can be alternatively visualized by keeping in mind that with the devices operating in saturation the gate-to-source voltages of $Q_2$ and $Q_3$ must "track" the voltage $e_1$. This being the case, the voltage at the source electrode of $Q_3$ must be $e_3-e_1$. Note that this is also the voltage at the gate electrode of $Q_2$. It follows that the voltage at the source electrode of $Q_2$ (i.e., $e_{out}$) must equal $e_3-2e_1$ for the tracking constraint to be met.

Figure 2:
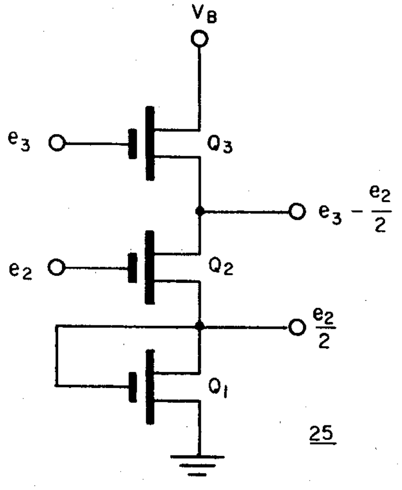

The foregoing analyses can be similarly applied to the voltage difference amplifier shown in FIG. 2. The amplifier 25 of FIG. 2 is like the previous amplifier 20 except that input terminals are coupled to the gate electrodes of $Q_2$ and $Q_3$ and the gate electrode of $Q_1$ is coupled to its drain electrode. (It is assumed in this and subsequent circuits that the input voltages are within the above-described ranges required for operation of the devices in saturation and also that drain-to-source saturation leakage currents are negligible. The voltage "tracking" constraint in this circuit requires that each device have a gate-to-source voltage of $e_2/2$. This condition can be visualized by realizing that the total of the gate-to-source voltages of $Q_1$ and $Q_2$ is $e_2$. Since these gate-to-source voltages must be equal, they must each be $e_2/2$. As indicated in FIG. 2, the voltage at the source of $Q_3$ must therefore equal $e_3-e_2/2$ so that all gate-to-source voltages equal $e_2/2$.

The family of difference amplifier circuits of the type shown in FIGS. 1 and 2 is fully described in the above referenced copending U.S. application Ser. No. 11,598. When additional devices are connected in similar manner various other difference voltage outputs can be obtained. For example, the referenced application shows that when a four-device arrangement is used an output difference voltage equal to one of the $$i_D=K(V_{gs1}-V_{th})^2$$
$$i_D=K(V_{gs2}-V_{th})^2$$
$$i_D=K(V_{gs3}-V_{th})^2$$

where:

$i_D$ is the drain current through each device, $K$ is the gain constant of each device, $V_{th}$ is the threshold voltage of each device, and $V_{gs1}$, $V_{gs2}$, $V_{gs3}$ are the gate-to-source voltages of $Q_1$, $Q_2$, $Q_3$ respectively. It should be noted that the values of $K$ and $V_{th}$ for each device are the same since substantially identical devices are being used. This is preferably achieved in practice by fabricating the devices in close proximity on the same semiconductor wafer. The above relationships are simultaneously satisfied only if $V_{gs1}=V_{gs2}=V_{gs3}$. Since $V_{gs1}=e_1$, it is seen that $V_{gs2}=V_{gs3}=e_1$. The voltage drop across the series arrangement can be expressed by the equation $$V_B=V_{ds1}+V_{ds2}+V_{ds3}, \quad (1)$$

where $V_{ds1}$, $V_{ds2}$ and $V_{ds3}$ are the drain-to-source voltages of $Q_1$, $Q_2$ and $Q_3$, respectively. Nothing that $V_{ds1}=e_{out}$ and $V_{ds2}=V_{gs2}=e$, Equation (1) can be rewritten as $$e_{out}=V_B-e_1-V_{ds3}. \quad (2)$$

The voltages associated with $Q_3$ can be expressed by the equation $$V_B-V_{ds3}=e_3-V_{gs3}. \quad (3)$$

Since $V_{gs3}=e_1$, Equation (3) can be rewritten as $$V_{ds3}=V_B+e_1-e_3. \quad (4)$$

Substituting the value of $V_{ds3}$ from Equation (4) in Equation (2) yields $$e_{out}=e_3-2e_1.$$

voltage. It is seen that $Q_2$ will therefore operate in saturation since for this device $V_{ds}$ equals $V_{gs}$ and the above condition is met whenever the device is on. In addition, by limiting the input voltages to ranges of values $V_{th}<e_1$ $e_3+V_{th}/3$ and $3V_{th}<e_3$ $V_B+V_{th}$ the transistors $Q_1$ and $Q_3$, respectively, are also constrained to operation in their saturation regions.

The drain current in each device of amplifier 20 is substantially equal since virtually no gate current flows in the MOSFET devices. With each device operating in the saturation region, the following square law relationships (assuming negligible drain-to-source saturation leakage) are in effect:

inputs minus three times the other input is obtainable. For purposes of the present invention the circuits of FIGS. 1 and 2 are of primary importance since they are the circuits utilized in digital-to-analog converters which translate information from a power-of-two weighting code.

Figure 3:
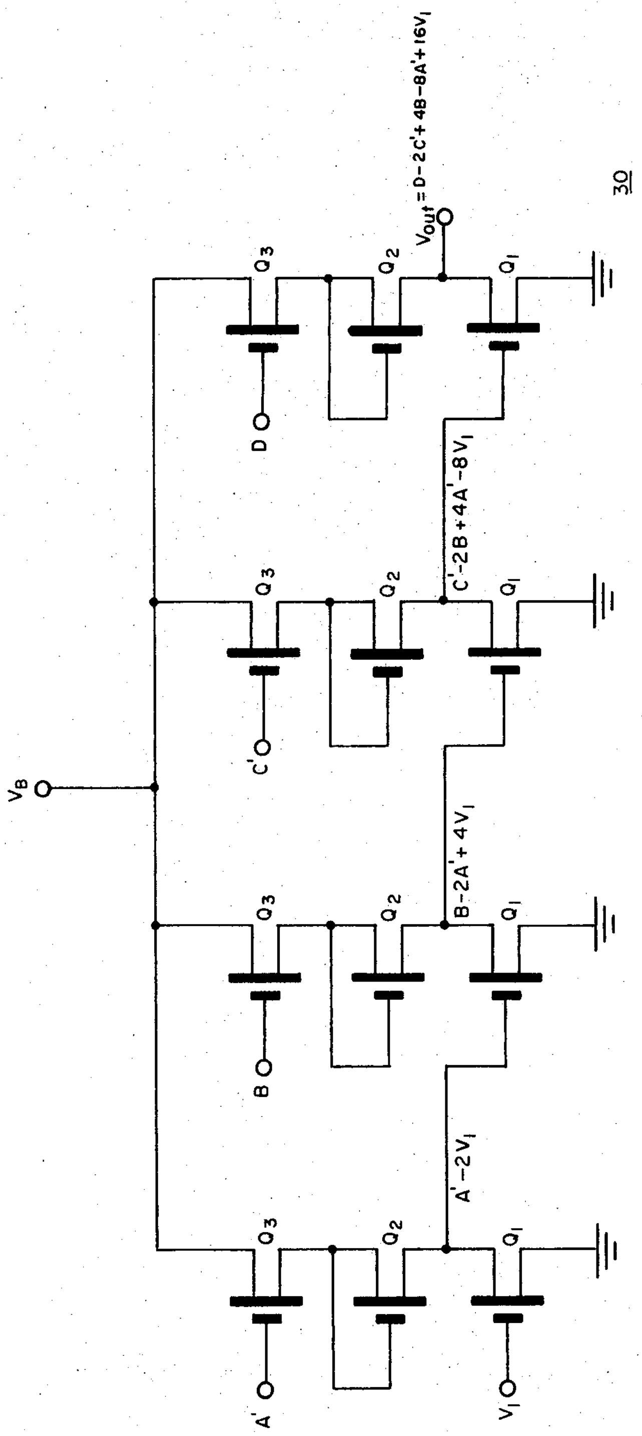
FIG. 3 is a schematic circuit diagram of one embodiment of the invention.

Referring now to FIG. 3 there is shown a digital-to-analog converter 30 in accordance with invention. THe circuit 30 is a 1-2-48 converter which receives four binary input voltages representing a number from 0 to 15 and produces an analog voltage corresponding to the number. The circuit 30 consists of four difference amplifier stages with each stage being of the type shown in FIG. 1 above. The output of each stage is directly coupled to a first input of the next stage in order with the output of the last stage producing the desired analog voltage. The first input of each stage is received at the gate electrode of $Q_1$ as is consistent with the circuit of FIG. 1. The first input of the first stage in the order is coupled to a fixed voltage $V_1$.

The second input to each stage is received at the gate electrode of $Q_3$ and consists of a voltage representative of a binary digit of the input number. These input voltages are denoted with letters A, B, C and D with A being he most significant digit of the number and D being the least significant. Each input can take on one of two voltage levels which correspond to a logical "1" and a logical "0." For example, a voltage level of 6.0 volts may correspond to a logical "0" and a voltage level of 6.1 volts may correspond to a logical "1." The inputs to he first and third stages are the complements of the actual number digits. THus, for example, the decimal number 15 is represented by 1,111 in binary form, but the inputs to circuit 30 would be 0101 since the first and third place digits are logical complements. Similarly, the inputs to circuit 30 for the decimal number ten are 0000 although the actual binary representation is 1,010.

The operation of circuit 30 can be explained by examining the output of each stage going from left to right in FIG. 3. It follows from the analysis of difference amplifier 20 of FIG. 1 that the output of the first stage of circuit 30 is $A'-2V_1$; i.e., the input voltage to $Q_3$ minus twice the input voltage to $Q_1$. Using the same reasoning it is seen that the outputs of the second, third and final stages, respectively, are $B-2A'+4V_1$, $C'-2B+4A'-8V_1$, and $D-2C'+4B-8A'+16V_1$. The output of the final stage, $V_{out}$, is the desired analog voltage which depends upon the input logic levels A, B, C, and D. The term "$16V_1$" is a constant which results from the biasing arrangement for the circuit.

To further illustrate the operation of circuit 30 assume that the bias voltage $V_B$ is 6.0 volts and that $V_1$ is fixed at 2.0 volts. As suggested above, also assume that an input voltage level of 6.0 volts corresponds to a logical "0" and an input voltage level of 6.1 volts corresponds to a logical "1." The voltage $V_{out}$ can now be calculated for any of the 16 possible combinations of input voltage levels. For example, the decimal number zero would correspond to input voltage levels of $A'$=6.1 volts, $B$=6.0 volts, $C'$=6.1 volts and $D$=6.0 volts. The voltage $V_{out}$ is therefore equal to (6.0)−2(6.1)+4(6.0)−8(6.1)+16(2)=1.0 volt. The analog voltage for the decimal number 15 can be similarly calculated as $V_{out}$=(6.1)−2(6.0)+4(6.1)−8(6.0)+16(2)=2.5 volts. The analog voltage outputs for all input combinations are listed in the following table:

| Decimal number | Input logic and corresponding voltage levels (Circuit 30) | | | | $V_{out}$ (volts) |
|---|---|---|---|---|---|
| | A′ | B | C′ | D | |
| 0 | 1 (6.1) | 0 (6.0) | 1 (6.1) | 0 (6.0) | 1.0 |
| 1 | 1 (6.1) | 0 (6.0) | 1 (6.1) | 1 (6.1) | 1.1 |
| 2 | 1 (6.1) | 0 (6.0) | 0 (6.0) | 0 (6.0) | 1.2 |
| 3 | 1 (6.1) | 0 (6.0) | 0 (6.0) | 1 (6.1) | 1.3 |
| 4 | 1 (6.1) | 1 (6.1) | 1 (6.1) | 0 (6.0) | 1.4 |
| 5 | 1 (6.1) | 1 (6.1) | 1 (6.1) | 1 (6.1) | 1.5 |
| 6 | 1 (6.1) | 1 (6.1) | 0 (6.0) | 0 (6.0) | 1.6 |
| 7 | 1 (6.1) | 1 (6.1) | 0 (6.0) | 1 (6.1) | 1.7 |
| 8 | 0 (6.0) | 0 (6.0) | 1 (6.1) | 0 (6.0) | 1.8 |
| 9 | 0 (6.0) | 0 (6.0) | 1 (6.1) | 1 (6.1) | 1.9 |
| 10 | 0 (6.0) | 0 (6.0) | 0 (6.0) | 0 (6.0) | 2.0 |
| 11 | 0 (6.0) | 0 (6.0) | 0 (6.0) | 1 (6.1) | 2.1 |
| 12 | 0 (6.0) | 1 (6.1) | 1 (6.1) | 0 (6.0) | 2.2 |
| 13 | 0 (6.0) | 1 (6.1) | 1 (6.1) | 1 (6.1) | 2.3 |
| 14 | 0 (6.0) | 1 (6.1) | 0 (6.0) | 0 (6.0) | 2.4 |
| 15 | 0 (6.0) | 1 (6.1) | 0 (6.0) | 1 (6.1) | 2.5 |

Figure 4:
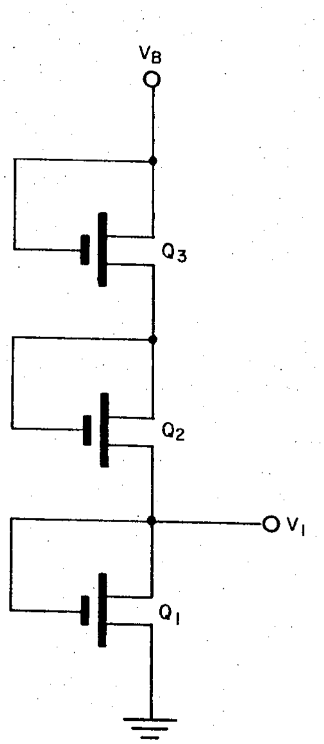
FIG. 4 is a schematic circuit diagram of a bias-generating circuit utilized in the invention.

The analog voltage $V_{out}$ for the above case rises in 0.1-volt increments for each integer increase in the input number. The range of the analog voltage $V_{out}$ generally depends upon the range between the input logic level voltages and upon the bias voltages used. The fixed voltage $V_1$ is instrumental in setting the operating points of each difference amplifier stage and should be substantially equal to $V_B/3$ (2 volts in the above case) for optimum operation of the circuit 30. FIG. 4 shows a convenient way of generating the voltage $V_1$ by utilizing the bias voltage $V_B$ and three identical FET devices. The devices are arranged in the same manner as the circuits of FIGS. 1 and 2 except that the gate electrode of each device is coupled to its respective drain electrode. The tracking constraint (which is derived as in the circuits of FIGS. 1 and 2) requires that the gate-to-source voltage of each device be equal. Since the three gate-to-source voltages must add up to $V_B$ it follows that each gate-to-source voltage must be $V_B/3$. The voltage $V_1$, taken at the drain electrode of $Q_1$, is therefore equal to $V_B/3$.

Figure 5:
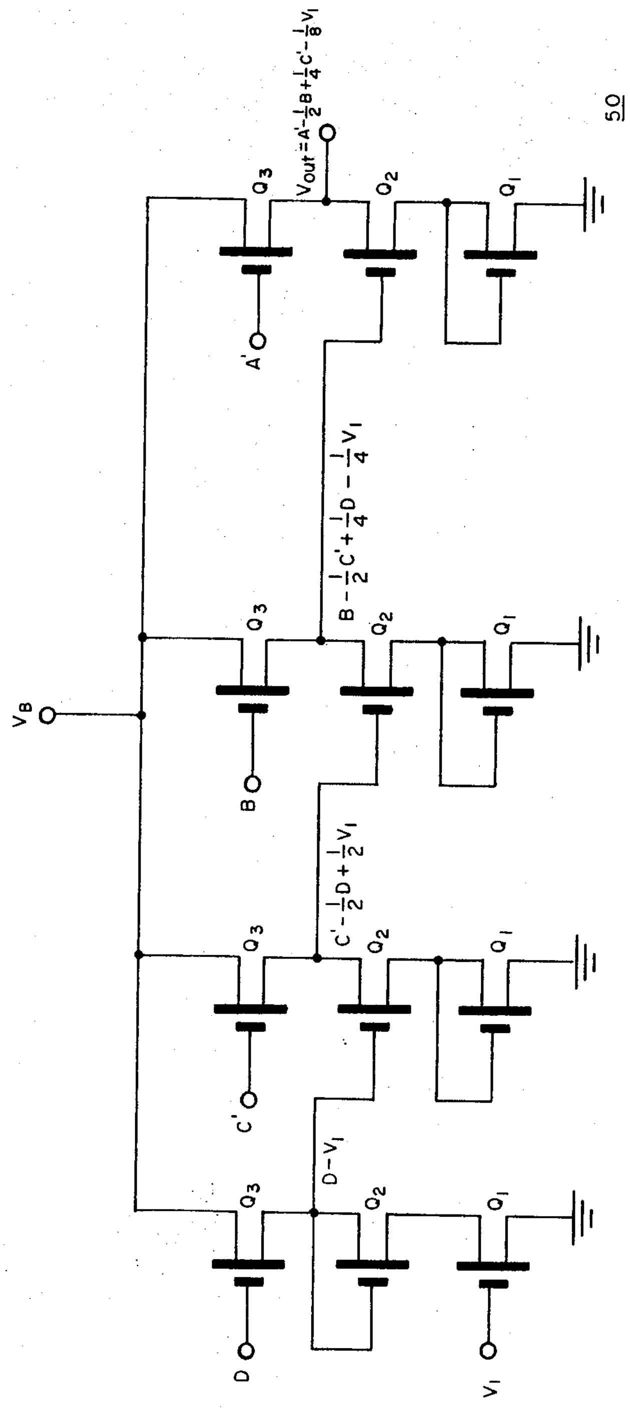
FIG. 5 is a schematic circuit diagram of another embodiment of the invention.

Referring now to FIG. 5, there is shown in digital-to-analog converter circuit 50 which is similar to circuit 30 of FIG. 3. The individual stages of circuit 50 consist of difference amplifiers of the type shown in FIG. 2. The output of each stage is taken at the drain electrode of the middle device $Q_2$ and is directly coupled to the gate electrode of the middle device of the next stage in the order. It follows from the analysis of difference amplifier 25 of FIG. 2 that the output of each stage is equal to the input voltage to $Q_3$ minus one-half the input voltage to $Q_2$. The output voltage of each stage is indicated in the FIG. 5 with the analog output voltage $V_{out}$ being $A'-\frac{1}{2}B+\frac{1}{4}C'-\frac{1}{8}D+\frac{1}{8}V_1$. Unlike circuit 30, the input to the first stage of circuit 50 is the least significant digit (D). In circuit 50, assume that an input voltage level of 6.8 volts corresponds to a logical "1" and that other voltage levels are the same as those in circuit 30. The analog voltage output table for all input combinations to circuit 50 is therefore as follows:

| Decimal number | Input logic and corresponding voltage levels (Circuit 50) A′ | B | C′ | D | $V_{out}$ (volts) |
|---|---|---|---|---|---|
| 0 | 1 (6.8) | 0 (6.0) | 1 (6.8) | 0 (6.0) | 3.5 |
| 1 | 1 (6.8) | 0 (6.0) | 1 (6.8) | 1 (6.8) | 3.6 |
| 2 | 1 (6.8) | 0 (6.0) | 0 (6.0) | 0 (6.0) | 3.7 |
| 3 | 1 (6.8) | 0 (6.0) | 0 (6.0) | 1 (6.8) | 3.8 |
| 4 | 1 (6.8) | 1 (6.8) | 1 (6.8) | 0 (6.0) | 3.9 |
| 5 | 1 (6.8) | 1 (6.8) | 1 (6.8) | 1 (6.8) | 4.0 |
| 6 | 1 (6.8) | 1 (6.8) | 0 (6.0) | 0 (6.0) | 4.1 |
| 7 | 1 (6.8) | 1 (6.8) | 0 (6.0) | 1 (6.8) | 4.2 |
| 8 | 0 (6.0) | 0 (6.0) | 1 (6.8) | 0 (6.0) | 4.3 |
| 9 | 0 (6.0) | 0 (6.0) | 1 (6.8) | 1 (6.8) | 4.4 |
| 10 | 0 (6.0) | 0 (6.0) | 0 (6.0) | 0 (6.0) | 4.5 |
| 11 | 0 (6.0) | 0 (6.0) | 0 (6.0) | 1 (6.8) | 4.6 |
| 12 | 0 (6.0) | 1 (6.8) | 1 (6.8) | 0 (6.0) | 4.7 |
| 13 | 0 (6.0) | 1 (6.8) | 1 (6.8) | 1 (6.8) | 4.8 |
| 14 | 0 (6.0) | 1 (6.8) | 0 (6.0) | 0 (6.0) | 4.9 |
| 15 | 0 (6.0) | 1 (6.8) | 0 (6.0) | 1 (6.8) | 5.0 |

It is seen that the range of $V_{out}$ in circuit 50 (3.5 to 5.0 volts) is at a higher level than in the prior circuit 30. This is because the output in circuit 50 is taken at $Q_2$ which operates at a higher voltage than $Q_1$. The output increment in circuit 50 is 0.1 volt per integer; i.e., one-eighth of the range between input logic levels. This points out an advantage of the "divide"-type of converter (such as circuit 50) over the "multiply"-type converter (such as circuit 30). In circuit 30, the output increment is equal to the voltage range between input logic levels. The input voltage range is therefore severely limited by the operating range of the device at which the output is taken. In circuit 50, however, the output increment is equal to one-eighth of the input voltage range. Therefore, a wider range of input voltage levels can be used in circuit 50 than in circuit 30 for equivalent biasing conditions.

Another advantage of the "divide"-type converter is that the voltage which represents the most significant digit passes through only one amplifier stage. This means that any error introduced by the amplifier stages is minimized since the voltages representative of the least significant digits pass through the most amplifier stages. The opposite is true in the "multiply"-type converter wherein the voltage representative of the most significant digit passes through every amplifier stage.

What is claimed is:

1. Apparatus for receiving a plurality of input voltages representative of the ordered digits of a number and for generating an analog voltage of said number comprising:

a. a plurality of ordered amplifiers each being provided for a different digit of said number, each of said amplifiers comprising i. at least three field-effect devices having substantially identical operating characteristics, each of said devices having drain, source, and gate electrodes, said devices being connected in a series arrangement with the source electrode of each device coupled to the drain electrode of the next device in the arrangement, said series arrangement having a source end and a drain end, each of said devices except a first and second of said devices having its gate electrode coupled to its drain electrode;

ii. first and second input terminals coupled to the gate electrodes of said first and second devices, respectively, iii. an output terminal coupled to one of said drain electrodes, and iv. means for applying a first bias voltage between the drain and source ends of said series arrangement;

b. means for applying each of said input voltages to the first input terminal of its corresponding amplifier; and c. means for coupling the output terminal of each amplifier to the second input terminal of the next amplifier in order, the output of the last amplifier in the order providing said analog voltage.

2. The apparatus as defined by claim 1 further comprising means for applying a second bias voltage to the second input terminal of the first amplifier in the order.

3. The apparatus as defined by claim 2 wherein all of the field-effect devices are substantially identical MOS field-effect transistors.

4. The apparatus as defined by claim 2 wherein said means for applying said second bias voltage comprises:

d. at least three field-effect devices having substantially identical operating characteristics, each of said devices having drain, source, and gate electrodes, said devices being connected in a series arrangement, with the source electrode of each device coupled to the drain electrode of its adjacent device, each of said devices having its gate electrode coupled to its drain electrode; and e. means for applying said first bias voltage across said series arrangement.

5. The apparatus as defined by claim 2 wherein each of said amplifiers comprises three devices and within each amplifier said first device is at the source end of said series arrangement, said second device is at the drain end of said series arrangement, and said output terminal is coupled to the drain electrode of said first device.

6. The apparatus as defined by claim 5 wherein the voltage representative of the most significant digit of said number is applied to the first input terminal of the first amplifier in the order.

7. The apparatus as defined by claim 2 wherein each of said amplifiers comprises three devices and within each amplifier said first device is in the middle of said series arrangement, said second device is at the drain end of said series arrangement and said output terminal is coupled to the drain electrode of said first device.

8. The apparatus as defined by claim 7 wherein the voltage representative of the least significant digit of said number is applied to the first input terminal of the first amplifier in the order.

9. The apparatus as defined by claim 8 wherein said plurality equals four.

10. The apparatus as defined by claim 9 wherein said means for applying said second bias voltage comprises:

d. three field-effect devices having substantially identical operating characteristics, each of said devices having drain, source, and gate electrodes, said devices being connected in a series arrangement with the source electrode of each device coupled to the drain electrode of its adjacent device, each of said devices having its gate electrode coupled to its drain electrode; and e. means for applying said first bias voltage across said series arrangement.

11. The apparatus as defined by claim 10 wherein all of the field-effect devices are substantially identical MOS field effect transistors.

* * * * *